United States Patent [19]

Okumura

[11] Patent Number: 4,906,591

[45] Date of Patent: Mar. 6, 1990

[54] METHOD OF MANUFACTURING A SEMICONDUCTOR DEVICE HAVING AN ELECTRIC CONTACT PORTION

[75] Inventor: Yoshinori Okumura, Hyogo, Japan

[73] Assignee: Mitsubishi Denki Kabushiki Kaisha, Tokyo, Japan

[21] Appl. No.: 283,804

[22] Filed: Dec. 6, 1988

[30] Foreign Application Priority Data

Dec. 14, 1987 [JP] Japan ................................. 62-317808

[51] Int. Cl.⁴ ..................... H01L 21/00; H01L 21/02; H01L 21/28; H01L 21/265
[52] U.S. Cl. .................................. 437/189; 437/186; 437/193; 437/20; 437/27; 437/41; 437/46; 437/191; 148/DIG. 20
[58] Field of Search ............... 437/186, 189, 192, 193, 437/199, 27, 30, 41, 46; 148/DIG. 20

[56] References Cited

U.S. PATENT DOCUMENTS 4,502,206 3/1985 Schnable et al. ..................... 437/24

FOREIGN PATENT DOCUMENTS 0128668 10/1979 Japan ................................. 437/186
0046575 2/1987 Japan .

OTHER PUBLICATIONS

Tsuchimoto, J., Ion Implant. of Impurities in Polycryst. Silicon, Ion Implant. in Semicond., Ed. S. Namba, Plenum Press, 1974, pp. 605-612.
Wolf, S., Ion Implant. for VLSI, Chap. 9, Silicon Processing for the VLSI Era, vol. 1, Lattice Press, 1986, pp. 303-305.

Primary Examiner—Brian E. Hearn
Assistant Examiner—B. Everhart
Attorney, Agent, or Firm—Lowe, Price, LeBlanc, Becker & Shur

[57] ABSTRACT

In a method of manufacturing a semiconductor device having an electric contact, semiconductor regions (9) as a source or drain region of a MOS transistor, having a conductivity type opposite to that of a semiconductor substrate (1) are formed selectively on the substrate. An insulating layer (10) is formed on the substrate (1) to expose only a surface of each semiconductor region (9). Impurity ions of the conductivity type opposite to that of the substrate (1) are implanted into the exposed surface of each region (9). After that, a polycrystal silicon layer (13) is formed on the surface of each region (9) implanted with the impurity ions and on the insulating layer (10). Further, impurity ions of the conductivity type opposite to that of the substrate (1) are further implanted into the polycrystal silicon layer (13). The condition of implanting the impurity ions into the polycrystal silicon layer (13) is set by controlling implantation energy to enable the maximum point of concentration distribution of the impurity ions in a direction perpendicular to the surface of the substrate (1) to be distant from a position of the interface between the polycrystal silicon layer (13) and the substrate (1) by a dimension corresponding to a standard deviation of the concentration distribution of the impurity ions toward the polycrystal silicon layer (13).

11 Claims, 8 Drawing Sheets

POLYCRYSTAL SILICON LAYER | SEMICONDUCTOR SUBSTRATE (DIFFUSION LAYER)

METHOD OF MANUFACTURING A SEMICONDUCTOR DEVICE HAVING AN ELECTRIC CONTACT PORTION

BACKGROUND OF THE INVENTION

1. Field of the Invention

The present invention relates to methods of manufacturing semiconductor devices and particularly to an improvement of a manufacturing method for forming a direct electric contact portion (referred to hereinafter as a contact) between an impurity-diffused region in a semiconductor substrate and a connection layer of polycrystal silicon in a semiconductor integrated circuit device.

2. Description of the Background Art

Figure 1A:
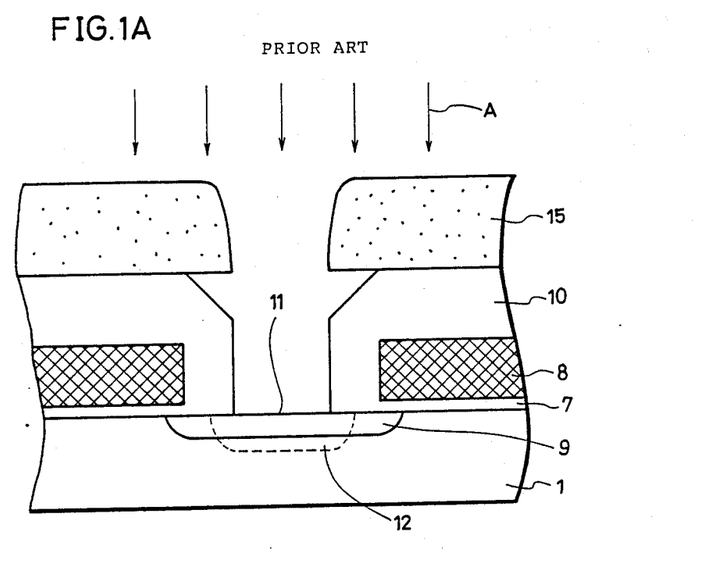
FIGS. 1A and 1B are partial sectional views showing successive steps of a conventional method of manufacturing a semiconductor device.
Figure 1B:
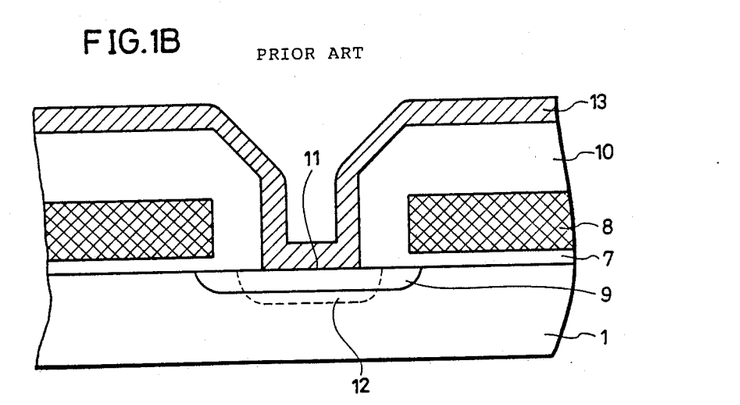

A conventional method for forming a contact in a semiconductor device is disclosed for example in Japanese Patent Laying-Open No. 165681/1980. FIGS. 1A and 1B are partial sectional views specifically showing successive steps of a method of forming a contact in a conventional method of manufacturing a semiconductor device.

Referring first to FIG. 1A, a gate insulating layer 7 is formed on a P type semiconductor substrate 1 by using a thermal oxidation process or the like. A single-layer of polycrystal silicon or a two-layer of polycrystal silicon and refractory metal silicide is deposited on the gate insulating layer 7 by a chemical vapor deposition (CVD) process or the like. After that, those layers are selectively removed by a photolithographic process, whereby gate electrodes 8 are formed with a spacing. Arsenic ions as an N type impurity are implanted into the semiconductor substrate 1 between the gate electrodes 8 by an ion implantation method. Then, heat treatment is applied, whereby an N type impurity diffused layer 9 is formed as a source or drain region of a transistor or the like. After an interlayer insulating layer 10 is deposited over the whole surface by a chemical vapor deposition process or the like, the interlayer insulating layer 10 is selectively removed by using a photolithographic technique, whereby a surface region of the N type impurity diffused layer 9, where a contact 11 is to be formed, is expose. N type impurity ions of an element having a relatively large mass number such as arsenic are implanted into the exposed region in the direction shown by the arrows A using a resist layer 15 as a mask. As a result, an N type impurity layer 12 is formed.

Referring to FIG. 1B, after the resist layer 15 is removed, a polycrystal silicon layer 13 is deposited over the surface region for the contact 11 and the interlayer insulating layer 10 by a chemical vapor deposition process or the like. Then, heat treatment is applied to the polycrystal silicon layer 13, whereby the contact 11 is formed by the N type impurity layer 12 and the impurity contained in the N type impurity layer 12 is diffused reversely into the polycrystal silicon layer 13. Thus, the contact 11 is formed as an electric contact portion between the polycrystal silicon layer 13 and the N type impurity layer 9.

However, the conventional contact forming method as described above has disadvantages that an average value of contact resistance and a standard deviation thereof among a plurality of contacts manufactured in a semiconductor chip as a single semiconductor device become large and cannot be disregarded as a connection resistance. The causes of such increase of the average value of contact resistance and the standard deviation thereof are considered to be as follows.

(a) A thin oxide layer naturally formed before deposition of the polycrystal silicon layer 13 is not removed after formation of the upper connection layer and a very thin naturally oxidized layer exists unavoidably on the surface of the contact 11 between the N type impurity layer 9 and polycrystal silicon layer 13.

(b) Although the impurity is reversely diffused into the polycrystal silicon layer 13, the impurity cannot be diffused in a sufficiently uniform manner in the polycrystal silicon layer 13.

On the other hand, a method for controlling contact resistance is disclosed for example in "PASPAC WITH LOW CONTACT RESISTANCE AND HIGH RELIABILITY IN CMOS LSIS", 1987 Symposium on VLSI Technology, Digest of Technical Papers, May 18-21 '87, pp. 77-78, in which after a polycrystal silicon layer is deposited on a region for forming a contact, conductive impurity ions (phosphorus (P) or boron fluoride ($BF_2$)) are implanted into the polycrystal silicon layer. According to this document, it is indicated that the contact resistance can be controlled dependent on a dose of impurity ions implanted into the polycrystal silicon layer. However, it is difficult to control the average value of contact resistance and the standard deviation thereof by only a dose of impurity ions implantation. Further, the controlling of a dose of impurity ions is not sufficient to break a naturally oxidized layer, which is considered to be a cause of increase of an average value of contact resistance and its standard deviation.

SUMMARY OF THE INVENTION

The present invention has been accomplished to solve the above described problems and it is an object of the present invention to provide a method of manufacturing a semiconductor device having an electric contact portion, with ion implantation energy conditions enabling control of contact resistance.

According to an aspect of the present invention, the object is to provide a method of manufacturing a semiconductor device having an electric contact portion, with ion implantation energy conditions enabling an average value of contact resistance and its standard deviation to be small.

According to another aspect of the present invention, the object is to provide a method of manufacturing a semiconductor device making it possible to form an electric contact portion between a conductive layer and a semiconductor region, which is suitable for large scale integration of semiconductor devices.

In a method of manufacturing a semiconductor device according to the present invention, semiconductor regions of a conductivity type opposite to that of a semiconductor substrate are selectively formed on the semiconductor substrate. An insulating layer is selectively formed on the semiconductor substrate to cause at least a surface of each semiconductor region to be exposed. Impurity ions of the conductivity type opposite to that of the semiconductor substrate are implanted into the exposed surface of each semiconductor region. After that, a polycrystal silicon layer is formed over the surfaces of the semiconductor regions and the insulating layer. Then, impurity ions of the conductivity type opposite to that of the semiconductor substrate are newly implanted into the polycrystal silicon layer. The condition for implanting the impurity ions into the polycrystal silicon layer is set as follows. A maximum value in distribution of impurity ion concentration in a direction perpendicular to the surface of the semiconductor substrate exists at a point distant from a position of a boundary face between the polycrystal silicon layer and the semiconductor substrate toward the polycrystal silicon layer by a distance corresponding to a standard deviation of the impurity ion concentration distribution.

Preferably, the impurity ions implanted are ions of arsenic or boron fluoride. In addition, a field effect device including the above described semiconductor region may be formed by the manufacturing method for the semiconductor device of the present invention. Further, forming the polycrystal silicon layer may include forming a connection layer in contact with the above described semiconductor region.

Implantation energy for implanting the impurity ions into the polycrystal silicon layer may be determined according to the type of the impurity ions and the thickness of the polycrystal silicon layer.

The implantation of the impurity ions into the polycrystal layer according to the present invention makes it possible to break sufficiently the naturally oxidized thin layer existing on the surface of the electric contact portion between the polycrystal silicon layer and the semiconductor region. In addition, in the impurity ion implantation conditions according to the present invention, a sufficient quantity of impurity ions can be contained in the polycrystal silicon layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the present invention will be described with reference to the drawings.

Figure 2A:
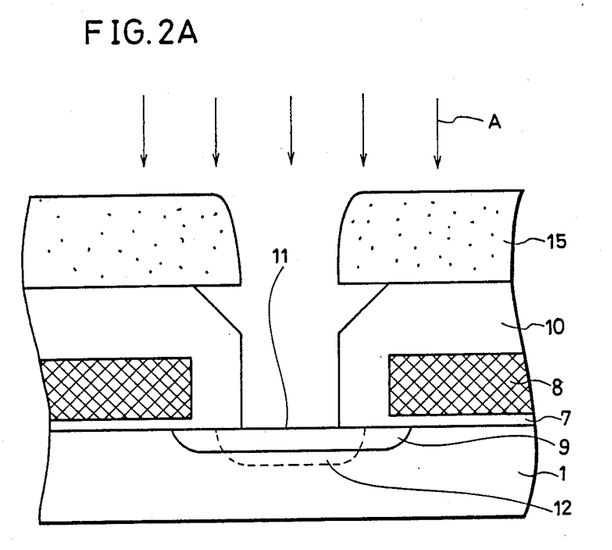
FIGS. 2A to 2C are partial sectional views showing successive steps particularly with regard to a contact forming method in a method of manufacturing a semiconductor device according to the present invention.
Figure 2B:
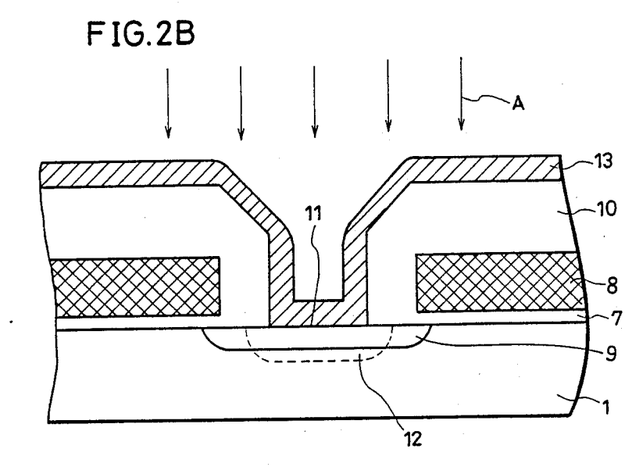

FIGS. 2A and 2B are partial sectional views showing successive steps particularly with reference to a contact forming method in an example of a method of manufacturing a semiconductor device according to the present invention.

Referring first to FIG. 2A, a gate insulation layer 7 is formed on a P type semiconductor substrate by a thermal oxidation process or the like. A single-layer of polycrystal silicon or a two-layer of polycrystal silicon and refractory metal silicide is deposited on the gate insulating layer 7 by a chemical vapor deposition process or the like and this layer is selectively removed by a photolithographic process, whereby gate electrodes 8 are formed. Then, arsenic ions as N type impurity are implanted into a region between the gate electrodes 8 in the semiconductor substrate 1 by an ion implantation process or the like, so that N type impurity diffused layer 9 as a source or drain region of a transistor or the like is formed. After an interlayer insulating layer 10 is deposited over the whole surface by a chemical vapor deposition process or the like, the layer 10 is selectively removed by using a photolithographic technique, whereby a surface of the N type impurity diffused layer 9 is exposed as a portion where a contact 11 is to be formed. Then impurity ions of an element having a relatively large mass number such as arsenic are implanted onto the exposed surface of the N type impurity diffused layer 9 in a direction indicated by the arrow A by using a resist layer 15 as a mask.

Figure 2C:
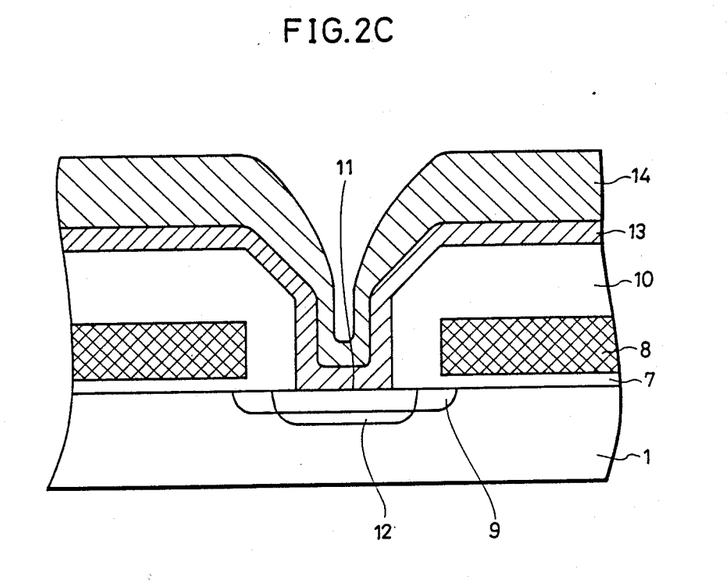

Referring to FIG. 2B, a polycrystal silicon layer 13 not containing conductive impurity is deposited over the exposed surface of the semiconductor substrate 1 and the interlayer insulating layer 10 by a chemical vapor deposition process or the like. After that, impurity ions of an element having a relatively large mass number such as arsenic are newly implanted onto the whole surface of the polycrystal silicon layer 13. Further, a refractory metal layer or a refractory metal silicide layer 14 is deposited by a chemical vapor deposition process, a sputtering process or the like and the layer 14 is selectively removed by using a photolithographic technique, thereby to form an upper connection layer including the polycrystal silicon layer 13 and the refractory metal layer or the refractory metal silicide layer 14, e.g., a bit line in a memory cell portion of a semiconductor memory device. Then, heat treatment is applied and an N type impurity diffused layer 12 is formed in the contact 11, thereby to enable electric connection between the polycrystal silicon layer 13 and the N type impurity diffused layer 9. Thus, the manufacturing of the contact is completed as shown in FIG. 2C.

Now, a method for determining conditions of ion implantation used in the present invention will be described.

In general, when accelerated ions are applied to a surface of an amorphous material, an ion implantation phenomenon occurs. Assuming that the ion flowing direction is coincident with a facial orientation of the target of the amorphous material, and that the direction is represented as a Z direction, a distribution $N(Z)$ in the Z direction (the depth direction) of implanted ions is almost coincident with a Gaussian distribution, which is expressed as follows.

$$N(Z) = \frac{No}{(2\pi)^{3/2}(\Delta Rp)} \exp\left(-\frac{(Z-Rp)^2}{2(\Delta Rp)^2}\right)$$

In this equation, Rp, ΔRp, and No are as follows:
Rp: projected range
ΔRp: standard deviation of projection
No: total number of implanted ions
$\Delta R_p$ and $\Delta R_p$ are quantities defined as follows:

$$Rp = \int_0^\infty Z\left[\frac{N(Z)}{No}\right]dZ$$

$$\Delta Rp = \int_0^\infty (Z-R\rho)^2 \left[\frac{N(Z)}{No}\right]dZ$$

Figure 3A:
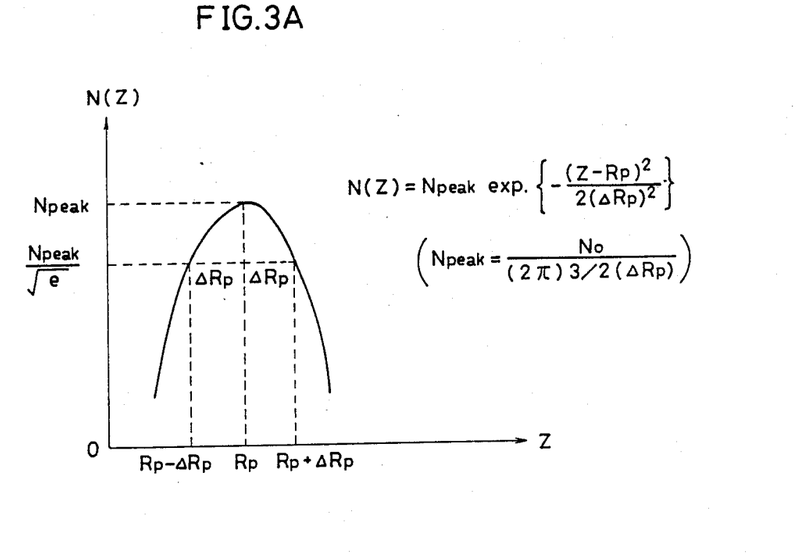
FIGS. 3A and 3B are graphs for explaining conditions of ion implantation according to the present invention.

If a distance from the target surface is represented as Z and the distribution of implanted ions in the depth direction is represented as N(Z), the Gaussian distribution represents by the above indicated equation is shown in FIG. 3A. If the target has a crystalline structure of Si single crystal or the like, incident ions distributed exceptionally deeply exist due to a channeling effect and there is a phenomenon that N(Z) deviates from the Gaussian distribution. However, in such a case, if the ion flowing direction is set to have an inclination (of about 8°) with respect to the facial orientation of the target, incident ions can be distributed relatively near the surface and thus N(Z) can be made to correspond to the Gaussian distribution. Accordingly, even if the target is of an amorphous material or a crystalline material, N(Z) can be made close to the Gaussian distribution if appropriate measures are taken, and the ion implantation phenomenon can be considered according to the Gaussian distribution.

The above mentioned Rp and ΔRp are constants determined as described below by implantation energy (E), a type (M) of implanted ions and a material (m) into which ions are implanted.

Rp=Rp (E, M, m)

ΔRp=ΔRp (E, M, m)

Figure 3B:
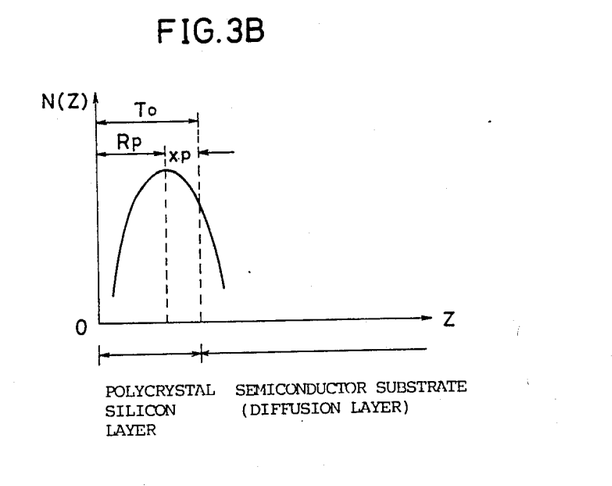

Now, let us consider a connection between the polycrystal silicon layer and the impurity diffused layer formed in the semiconductor substrate, with the thickness of the polycrystal silicon layer being represented as To. Distribution in the Z direction of implanted ions represented as N(Z) in this case is shown in FIG. 3B. Referring to this figure, a peak value of N(Z) corresponding to the projected range Rp exists at a point distant from the interface between the polycrystal silicon layer and the impurity diffused layer by xp toward the polycrystal silicon layer. Accordingly, a relation between the thickness To of the polycrystal silicon layer and the projected range Rp is represented by the following equation.

xp=To−Rp

Figure 4:
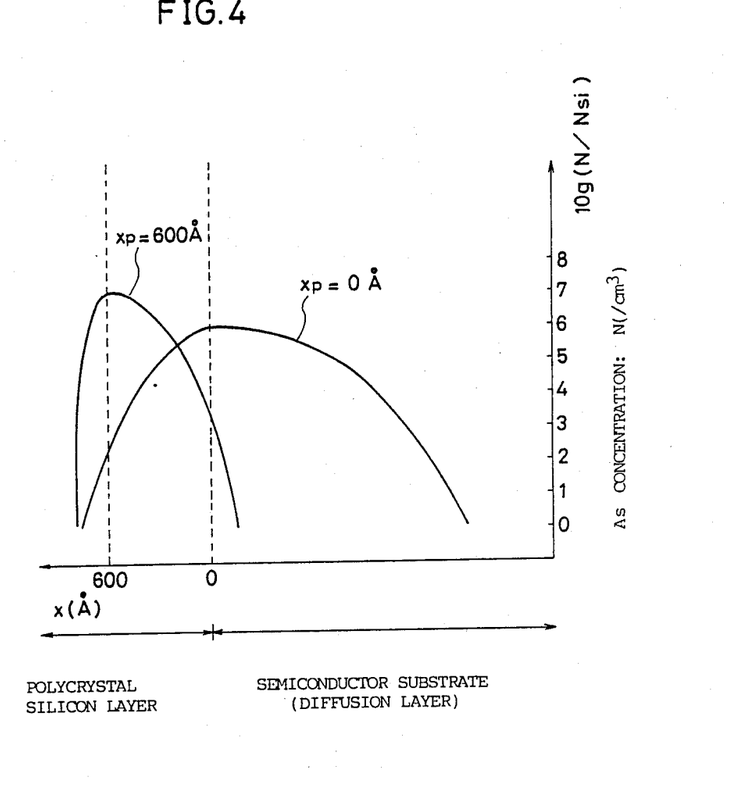
FIG. 4 is a graph of concentration distribution representing undesirable ion implantation conditions in an ion implantation method according to the present invention.
Figure 5:
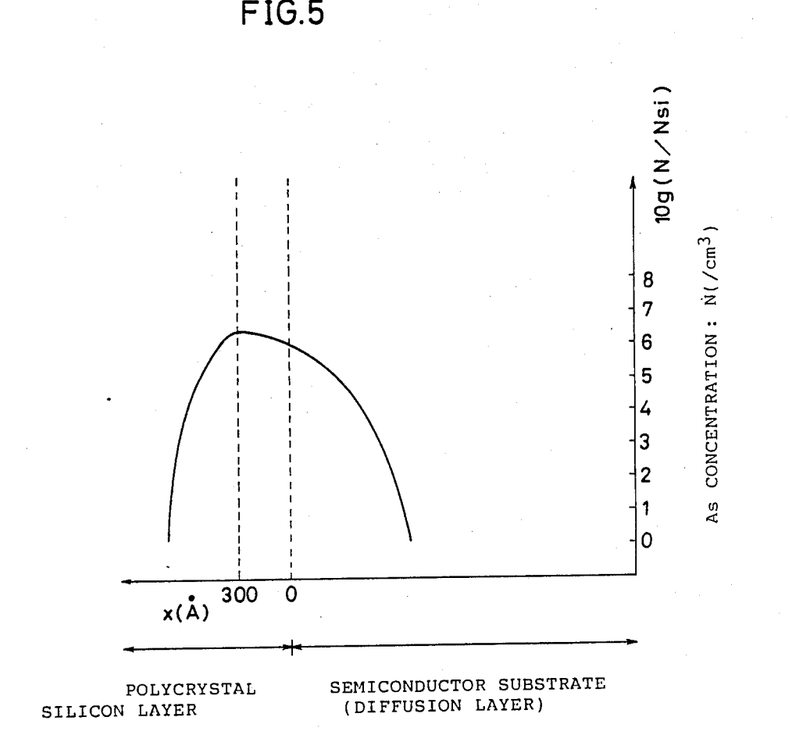
FIG. 5 is a graph of a concrete concentration distribution representing ion implantation conditions according to the present invention.

In this case, the interface between the polycrystal silicon layer and the N type impurity diffused layer may be taken as an origin, the polycrystal silicon layer is regarded as being on the positive side, and x, in FIGS. 4 and 5, is a positional coordinate in the direction perpendicular to the semiconductor substrate. Nsi is an impurity concentration of the semiconductor substrate. If the positional coordinates are thus set, a concentration distribution immediately after implantation of arsenic ions as the impurity ions into the polycrystal silicon layer is as shown in FIG. 4. FIG. 4 represents concentration distribution of impurity ions implanted with conditions of xp=600 Å and xp=0 Å. In these two implantation conditions, the below described problems arise.

In the implantation condition of xp=600 Å, a point representing a peak value of the concentration distribution immediately after implantation of impurity ions is distant from the interface between the semiconductor substrate and the polycrystal silicon layer by 600 Å. Accordingly, most of the impurity ions cannot attain the interface and the very thin naturally oxidized layer existing on the interface cannot be broken. In consequence, an average value of contact resistance and its standard deviation in a plurality of contacts in a semiconductor chip as a single semiconductor device become large and suitable contact can not be formed.

In the implantation condition of xp=0 Å, a point representing the peak value of the concentration distribution immediately after implantation of impurity ions exists on the contact interface and a considerable part of impurity ions attain the contact interface, whereby the very thin naturally oxidizd layer existing on the interface is broken to a sufficient extent. Accordingly, the standard deviation of contact resistance is considerably reduced. However, in this implantation condition, a large number of impurity ions enter the impurity diffused layer and the quantity of impurity ions existing in the polycrystal silicon layer is too small to sufficiently decrease the average value of contact resistance.

Thus, the ion implantation applied with either of the above described implantation conditions does not make it possible to form a contact having stable characteristics for enabling reduction of both of the average value and the standard deviation of contact resistance.

Therefore, the ion implantation condition in the present invention is set so that xp may be equal to the standard projection deviation $\Delta R_P$. If the implantation condition is thus set, it is made possible to decrease contact resistance between the polycrystal silicon layer and the impurity diffused layer in a stable manner. Then implantation energy E which satisfies this condition is determined by the following equations.

xp=ΔRp

ΔRp=To−Rp

ΔRp (E, M, m)=To−Rp (E, M, m)

In this embodiment, since M is arsenic and m is polycrystal silicon, the injection energy E is a function of only the thickness To of the polycrystal silicon layer and thus the energy in the implantation condition can be obtained by the following equation:

E=E(To)

FIG. 5 is a graph showing a concentration distribution of impurity ions in which the above described implantation condition is specifically indicated. The concentration distribution of FIG. 5 is a distribution of concentration of arsenic ions implanted as impurity ions. Referring to FIG. 5, a peak of the impurity ion concentration distribution exists at a point inside the polycrystal silicon layer, distant by 300 Å from the contact interface between the polycrystal silicon layer and the impurity diffusion layer and this distance corresponds to the standard deviation in the projected range at the time of implanting ions. The accelerating voltage as the implantation energy for arsenic ions at this time is 100 keV and the thickness of the polycrystal silicon layer into which the ions are implanted is 1000 Å. In those conditions, the percentage of the impurity ions attaining the contact interface is as large as about 20% of the implanted ions and the very thin naturally oxidized layer existing on the contact interface is sufficiently broken, causing the standard deviation of contact resistance to be small. In other words, irregularities in the contact resistance can be reduced. In addition, since 80% of implanted impurity ions are contained in the polycrystal silicon layer, the average value of contact resistance can be also reduced.

Figure 6:
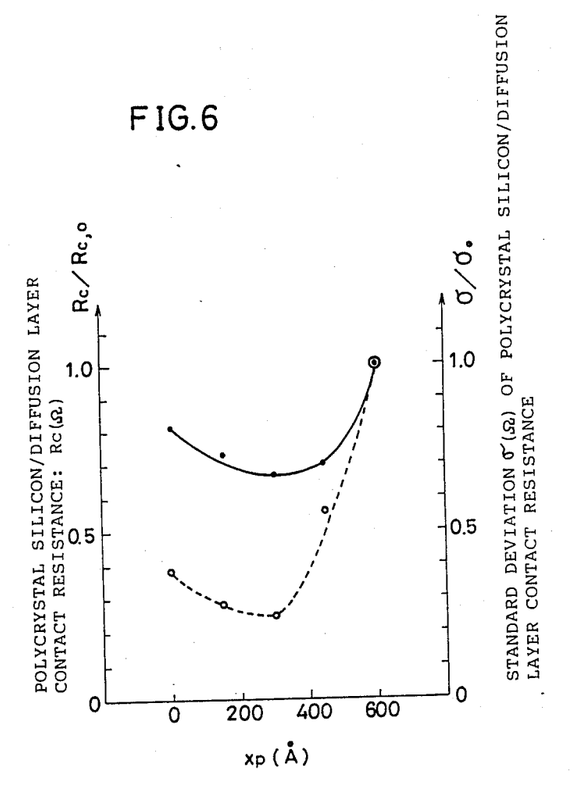
FIG. 6 is a graph showing a decreasing effect of an average value of contact resistance and a standard deviation thereof achieved by using the ion implantation conditions according to the present invention.

FIG. 6 is a graph in which an average value Rc of real contact resistance (shown by a solid line) and a standard deviation $\sigma$ thereof (shown by a broken line) are represented as functions of xp. Rc,o indicates an average value of contact resistance with the conventional implantation condition of xp=600 Å, and $\sigma$ indicates a standard deviation of contact resistance with the conventional implantation condition of xp=600 Å. According to this figure, the average value and the standard deviation of contact resistance are large with the implantation condition of xp=600 Å. On the other hand, with the implantation condition of xp=0 Å, the standard deviation of contact resistance is small but the average value of contact resistance is large. It can be seen from this figure that with the implantation condition of xp=300 Å according to the present invention, a real contact resistance, and the average value and the standard deviation thereof are made small for the above described reasons. Furthermore, it is indicated in this figure that by using the implantation condition of the present invention, the average value and the standard deviation of contact resistance become smallest. Thus, the implantation condition of the present invention provides the optimum value of contact resistance.

The reasons for using arsenic ions as the impurity ions to be implanted in this embodiment are as follows.

According to increase of integration scale and density of semiconductor devices, dimensions between each contact 11 and the respective gate electrodes 8 become small. If a junction depth of the impurity diffused layer 12 for electric connection between the polycrystal silicon layer 13 and the impurity diffused layer 9 is increased in such a case, the impurity diffused layer 12 extends widely in the direction parallel to the main surface of the semiconductor substrate 1 and enters excessively the channel region of the gate transistor. As a result, the gate transistor will be broken, causing lowering of a threshold voltage of the transistor punched-through or lowering of a withstand voltage of the source-drain voltage. Therefore, it is necessary to form an impurity diffused layer 12 having a shallow junction suitable for large integration scale and high density of devices, thereby to provide electric connection between the polycrystal silicon layer 13 and the impurity diffused layer 9. For this reason, impurity of an element having a large mass number such as arsenic is used as the impurity forming the impurity diffused layer 12. Ions of such an element having a large mass number are not diffused to a large extent if heat treatment is applied, and thus, the diffused layer forms a shallow junction, which is suitable for large integration scale and high density of semiconductor devices.

Although arsenic is used as the N type impurity in the P type semiconductor substrate in the above described embodiment, P type impurity such as boron fluoride may be used for an N type semiconductor substrate. In addition, the impurity to be used is not limited to arsenic as the N type impurity or boron fluoride as the P type impurity and, needless to say, impurity ions of any element may be used insofar as the above described meritorious effects can be produced by such ions.

Description is now made of an example of a semiconductor device in which a semiconductor region having a contact formed according to the present invention is utilized for a capacitor for charge storage.

Figure 7:
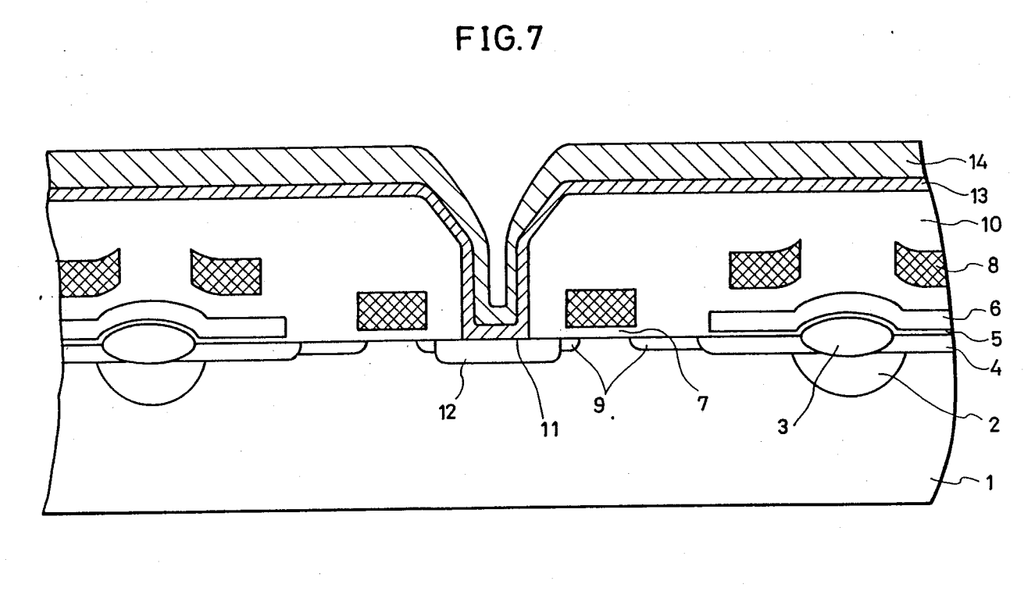
FIG. 7 is a partial sectional view of a semiconductor memory device to which a method of manufacturing a semiconductor device according to the present invention is applicable.

FIG. 7 is a partial sectional view of a semiconductor memory device formed by using a method of manufacturing a semiconductor device according to the present invention. Referring to FIG. 7, after ions of P type impurity such as boron are implanted selectively on a P type semiconductor substrate 1, a thermal oxidization process is applied to form a P type impurity diffused layer 2 for prevention of inversion and a thick isolation oxide layer 3. Then, N type impurity ions are implanted by an ion implantation method or the like and heat treatment is applied to form an N type impurity diffused layer 4. After that, a thin capacitor gate insulating layer 5 is formed by a thermal oxidation process or a chemical vapor deposition process. A polycrystal silicon containing conductive impurity is deposited on the capacitor gate insulating layer 5 by a chemical vapor deposition process or the like and the layers are selectively removed by a photolithographic technique so that cell plates 6 are formed. Thus, an N type impurity diffused layer 4 and a cell plate 6 constitute a capacitor. In this figure, the reference numeral 8 denotes transfer gate electrodes (word lines), and a polycrystal silicon layer 13 and a refractory metal layer or refractory metal silicide layer 14 are formed as bit lines. Electric connection between the polycrystal silicon layer 13 and the N type impurity diffused layer 9 is made by forming an N type impurity diffused layer 12 in a contact 11 according to the method of the present invention. The transfer gate electrodes 8 are formed above the N type impurity diffused layer 9. Thus, MOS transistors are formed.

Although the contact formed according to the present invention is used for the semiconductor memory device in the above described example, the present invention is not limited to semiconductor memory devices and it is applicable to various semiconductor devices at least having contacts.

As described in the foregoing, according to the present invention, the condition of implanting impurity ions into the polycrystal silicon layer is set so that the maximum point in distribution of impurity ion concentration immediately after the implantation is at a point entering the polycrystal silicon layer by a distance corresponding to a standard deviation of the concentration distribution from the contact interface between the polycrystal silicon layer and the semiconductor region. In consequence, the naturally oxidized layer on the contact interface can be broken sufficiently and the polycrystal silicon layer contains a sufficient quantity of impurity ions. Accordingly, it is made possible to minimize the average value and the standard deviation of contact resistance in the plurality of contacts in a semiconductor chip to be manufactured as a single semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having an electric contact, comprising the steps of:
   preparing a semiconductor substrate (1) having a main surface and having a predetermined concentration of impurity of a conductivity type,
   selectively forming semiconductor regions (9) of conductivity type opposite to that of said semiconductor substrate (1), spaced from each other on said semiconductor substrate,
   forming an insulating layer (10) over said semiconductor substrate,
   selectively removing said insulating layer (1) to expose at least a surface of each said semiconductor region (9),
   implanting impurity ions of the conductivity type opposite to that of said semiconductor substrate (1) into the exposed surface of each of said semiconductor regions (9),
   forming a polycrystal silicon layer (13) over the exposed surface of said semiconductor region (9) and said insulating layer (10),
   implanting impurity ions of the conductivity type opposite to that of said semiconductor substrate (1) into said polycrystal silicon layer (13), wherein
   said step of implanting the impurity ions into said polycrystal silicon layer (13) is executed by controlling implantation energy to set a maximum point of concentration distribution of said impurity ions in a direction perpendicular to said main surface to be at a position distant from an interface between said polycrystal silicon layer (13) and said semiconductor substrate (1) by a distance corresponding to a standard deviation of said concentration distribution toward said polycrystal silicon layer (13), and
   annealing said polycrystal silicon layer (13) in a vicinity of said semiconductor substrate (9) whereby an electric contact portion (11) is formed between each said semiconductor regions (9) and said polycrystal silicon layer (13).

2. A method of manufacturing a semiconductor device having an electric contact in accordance with claim 1, wherein
   said implantation energy is determined by a type of said impurity ions and a thickness of said polycrystal silicon layer (13).

3. A method of manufacturing a semiconductor device having an electric contact in accordance with claim 1, wherein
   said step of implanting said impurity ions includes the step of implanting arsenic ions.

4. A method of manufacturing a semiconductor device having an electric contact in accordance with claim 1, wherein
   said step of implanting said impurity ions includes the step of implanting boron fluoride ions.

5. A method of manufacturing a semiconductor device having an electric contact in accordance with claim 1, wherein said method further comprises the step of forming a semiconductor element near each said semiconductor region (9) on the main surface of said semiconductor substrate (1).

6. A method of manufacturing a semiconductor device having an electric contact in accordance with claim 5, wherein
   said step of forming the semiconductor regions (9) comprises the step of forming part of a field effect element.

7. A method of manufacturing a semiconductor device having an electric contact in accordance with claim 6, wherein
   said step of forming part of the field effect element comprises the steps of:
   forming an insulated gate (8) over said semiconductor substrate (1), and
   forming one semiconductor region and the other semiconductor region (9) on said semiconductor substrate (1) under said insulated gate (8), whereby a channel region is formed in said semiconductor substrate (1) between said one and other semiconductor regions (9).

8. A method of manufacturing a semiconductor device having an electric contact in accordance with claim 7, wherein
   said step of forming the polycrystal silicon layer (13) includes the step of forming a connection layer in contact with either of said one and other semiconductor regions (9).

9. A method of manufacturing a semiconductor device having an electric contact in accordance with claim 8, wherein
   said step of forming either of said one and other semiconductor regions includes the step of forming an insulating layer (3) for isolating said semiconductor regions.

10. A method of manufacturing a semiconductor device having an electric contact in accordance with claim 9, wherein
    said step of forming the insulating layer (3) for the isolation includes the step of forming a region (2) for preventing inversion in a region of said semiconductor substrate (1) under said insulating layer (3) to be formed.

11. A method of manufacturing a semiconductor device having an electric contact in accordance with claim 10, further comprising the step of forming an insulating layer (5) on said isolated semiconductor regions and said insulating layer (3) for the isolation and forming a conductive layer (6) on said insulating layer (5), whereby
    said conductive layer (6) and each said semiconductor region constitute a capacitor for charge storage.

* * * * *